United States Patent
Anholt et al.

(10) Patent No.: US 8,429,498 B1
(45) Date of Patent: Apr. 23, 2013

(54) DUAL ECC DECODER

(75) Inventors: Micha Anholt, Tel Aviv (IL); Naftali Sommer, Rishon Lezion (IL); Ronen Dar, Tel Aviv (IL); Uri Perlmutter, Ra'anana (IL); Tal Inbar, Hod-Hasharon (IL)

(73) Assignee: Apple Inc., Cupertino, CA (US)

( * ) Notice: Subject to any disclaimer, the term of this patent is extended or adjusted under 35 U.S.C. 154(b) by 616 days.

(21) Appl. No.: 12/728,289

(22) Filed: Mar. 22, 2010

Related U.S. Application Data (60) Provisional application No. 61/163,146, filed on Mar. 25, 2009, provisional application No. 61/175,030, filed on May 3, 2009, provisional application No. 61/234,699, filed on Aug. 18, 2009, provisional application No. 61/264,809, filed on Nov. 29, 2009.

(51) Int. Cl.
   *G11C 29/00* (2006.01)
(52) U.S. Cl.
   USPC .......................... 714/764; 365/227
(58) Field of Classification Search ............. 365/189.11, 365/222, 339, 227; 714/769, 773, 764; 713/502, 713/320; 341/50; 348/730
   See application file for complete search history.

(56) References Cited

U.S. PATENT DOCUMENTS

| | | | |
|---|---|---|---|
| 4,414,623 A * | 11/1983 | Davis et al. ................... | 713/502 |
| 4,845,713 A | 7/1989 | Zook | |
| 5,267,242 A | 11/1993 | Lavalee et al. | |
| 6,047,395 A | 4/2000 | Zook | |
| 6,353,909 B1 | 3/2002 | Amrany et al. | |
| 6,385,751 B1 | 5/2002 | Wolf | |
| 6,631,488 B1 | 10/2003 | Stambaugh et al. | |
| 6,938,196 B2 | 8/2005 | Richardson et al. | |
| 6,982,659 B2 | 1/2006 | Shen et al. | |
| 7,114,086 B2 * | 9/2006 | Mizuyabu et al. ............ | 713/320 |
| 7,184,351 B2 * | 2/2007 | Ito et al. ........................ | 365/222 |
| 7,184,352 B2 * | 2/2007 | Klein et al. .................... | 365/222 |
| 7,475,103 B2 | 1/2009 | Novichkov et al. | |
| 7,478,310 B2 | 1/2009 | Jung et al. | |

(Continued)

FOREIGN PATENT DOCUMENTS

| | | |
|---|---|---|
| WO | 2007052991 A1 | 5/2007 |
| WO | 2007132453 A2 | 11/2007 |

(Continued)

OTHER PUBLICATIONS

Blahut, R., "Algebraic Codes for Data Transmission", Chapter 3.6, pp. 62-63, Cambridge University Press 2003.

(Continued)

*Primary Examiner* — David Ton
(74) *Attorney, Agent, or Firm* — Meyertons, Hood, Kivlin, Kowert & Goetzel, P.C.

(57) ABSTRACT

A decoding apparatus includes a decoder and a control unit. The decoder includes circuitry that is configured to decode an Error Correction Code (ECC) by operating in one of a first operational mode having a first power consumption, and a second operational mode, in which at least part of the circuitry that is active during the first operational mode is deactivated and which has a second power consumption that is lower than the first power consumption. The control unit is configured to evaluate a criterion with respect to an input code word, to select one of the first and second operational modes responsively to the criterion, and to invoke the decoder to decode the input code word using the selected operational mode.

36 Claims, 4 Drawing Sheets

U.S. PATENT DOCUMENTS

| | | | |
|---|---|---|---|
| 7,783,905 B2* | 8/2010 | Chang et al. | 713/320 |
| 8,139,426 B2* | 3/2012 | Park et al. | 365/189.11 |
| 2006/0214820 A1* | 9/2006 | Kleihorst et al. | 341/50 |
| 2007/0013816 A1* | 1/2007 | Martin | 348/730 |
| 2007/0198895 A1 | 8/2007 | Paumier et al. | |
| 2008/0172592 A1 | 7/2008 | Wehn et al. | |
| 2008/0198650 A1 | 8/2008 | Shalvi et al. | |
| 2009/0024905 A1 | 1/2009 | Shalvi et al. | |
| 2009/0070659 A1 | 3/2009 | Zhong et al. | |
| 2009/0077449 A1 | 3/2009 | Lee | |
| 2009/0094470 A1 | 4/2009 | Gao et al. | |
| 2009/0106485 A1 | 4/2009 | Anholt | |
| 2009/0187803 A1 | 7/2009 | Anholt et al. | |
| 2009/0199074 A1 | 8/2009 | Sommer | |
| 2009/0249159 A1 | 10/2009 | Lee et al. | |
| 2009/0282320 A1 | 11/2009 | Liao et al. | |
| 2010/0306626 A1 | 12/2010 | Keays et al. | |
| 2011/0107188 A1* | 5/2011 | Dror et al. | 714/773 |

FOREIGN PATENT DOCUMENTS

| | | | |
|---|---|---|---|
| WO | 2007132457 A2 | 11/2007 | |
| WO | 2008026203 A2 | 3/2008 | |
| WO | 2008053472 A2 | 5/2008 | |
| WO | 2008139441 A2 | 11/2008 | |
| WO | 2009053961 A2 | 4/2009 | |
| WO | 2009072103 A2 | 6/2009 | |
| WO | 2009072105 A2 | 6/2009 | |
| WO | 2009074979 A2 | 6/2009 | |

OTHER PUBLICATIONS

Chen et al., "Small Area Parallel Chien Search Architectures for Long BCH Codes", IEEE Transactions on Very Large Scale Integration (VLSI) Systems, vol. 12, No. 5, pp. 656-549, May 2004.

Ha et al., "Rate-Compatible Punctured Low Density Parity Check Codes with Short Block Lengths", IEEE Transactions on Information Theory, vol. 52, No. 2, pp. 728-738, Feb. 2006.

Han et al., "An Efficient Dynamic Schedule for Layered Belief-Propagation Decoding of LDPC Codes", IEEE Communication Letters, vol. 13, No. 12, pp. 950-952, Dec. 2009.

IEEE Standard 802.11n-2009 "IEEE Standard for Information Technology—Telecommunications and Information Exchange Between Systems—Local and Metropolitan Area Networks—Specific Requirements Part 11: Wireless LAN Medium Access Control (MAAC) and Physical Layer (PHY) Specifications", Oct. 29, 2009.

Kim et al., "Design of Rate-Compatible Irregular LDPC Codes for Incremental Redundancy Hybrid ARQ Schemes", IEEE International Symposium on Information Theory (ISIT), pp. 1139-1143, Seattle, USA, Jul. 2006.

Kou et al., "Low Density Parity Check Codes Based on Finite Geometries: A Rediscovery and New Results", IEEE Transactions on Information Theory, vol. 47, No. 7, pp. 2711-2736, Nov. 2001.

Li et al., "Rate-Compatible Low Density Parity Check Codes for Capacity-Approaching ARQ Schemes in Packet Data Communications", Proceedings of the International Conference on Communications, Internet and Information Technology (CIIT), U.S. Virgin Islands, Nov. 2002.

Yazdani et al., "On Construction of Rate-Compatible Low-Density Parity-Check Codes", IEEE Communication Letters, vol. 8, No. 3, pp. 159-161, Mar. 2004.

U.S. Appl. No. 12/843,029 "Efficient LDPC codes", filed Jul. 25, 2010.

U.S. Appl. No. 12/797,615 "Chien search using multiple basis representation", filed Jun. 10, 2010.

Whiting, D.L., "Bit-Serial Reed-Solomon Decoders in VLSI", Doctor Thesis, California Institute of Technology, Aug. 22, 1984.

U.S. Appl. No. 12/355,817 Official Action dated Dec. 22, 2011.

Chase, D., "A Class of Algorithms for Decoding Block Codes with Channel Measurement Information", IEEE Transactions on Information Theory, vol. IT-18, No. 1, pp. 170-182, Jan., 1972.

Blahut, R.E., "Theory and Practice of Error Control Codes", chapter 6, sections 6.1-6.3, pp. 130-140, Addison-Wesley Publishing Company, Inc., USA, 1983.

Blahut, R.E., "Algebraic Codes for Data Transmission", chapter 6, pp. 131-166, and chapter 7, pp. 179-190, 217-233, Cambridge University Press, UK, 2004.

Chien, R.T., "Cyclic Decoding Procedures for Bose-Chaudhuri-Hocquenghem Codes", IEEE Transactions on Information Theory, vol. IT-10, pp. 357-363, Oct. 1964.

Lin et al., "Error control coding: fundamentals and applications", chapter 6, pp. 209-215; chapter 7, pp. 241-255; chapter 17.6, pp. 871-880, 2nd edition, Pearson Education, Inc., USA, 2004.

Anholt et al., U.S. Appl. No. 12/419,304 "High-Performance ECC Decoder" filed Apr. 7, 2009.

Gallager, R.G., "Low-Density Parity-Check Codes", Cambridge, USA, Jul. 1963.

Bez et al., "Introduction to Flash memory", Proceedings of the IEEE, vol. 91, No. 4, pp. 489-502, Apr. 2003.

Eitan et al., "Multilevel Flash Cells and their Trade-Offs", Proceedings of the 1996 IEEE International Electron Devices Meeting (IEDM), pp. 169-172, New York, USA 1996.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Gallager, R.G., "Low-Density Parity-Check Codes", IRE Transactions on Information Theory, pp. 21-28, Jan. 1962.

Wu et al., "Parallel Weighted Bit-Flipping Decoding", IEEE Communication Letters, vol. 11, No. 8, pp. 671-673, Aug. 2007.

Sharon et al., "Efficient Serial Message-Passing Schedules for LDPC Decoding", IEEE Transactions on Information Theory, vol. 53, No. 11, pp. 4076-4091, Nov. 2007.

Forney, D. G., "Generalized Minimum Distance Decoding", IEEE Transactions on Information Theory, vol. IT-12, No. 2, pp. 125-131, Apr. 1966.

Darabiha et al., "Power Reduction Techniques for LDPC Decoders", IEEE Journal of Solid-State Circuits, vol. 43, No. 8, pp. 1835-1845, Aug. 2008.

* cited by examiner

DUAL ECC DECODER

CROSS-REFERENCE TO RELATED APPLICATIONS

This application claims the benefit of U.S. Provisional Patent Application 61/163,146, filed Mar. 25, 2009, U.S. Provisional Patent Application 61/175,030, filed May 3, 2009, U.S. Provisional Patent Application 61/234,699, filed Aug. 18, 2009, and U.S. Provisional Patent Application 61/264,809, filed Nov. 29, 2009, whose disclosures are incorporated herein by reference.

FIELD OF THE INVENTION

The present invention relates generally to error correction coding, and particularly to efficient decoding of error correction codes.

BACKGROUND OF THE INVENTION

Error Correction Coding (ECC) is used in many applications, such as in digital communication and data storage systems. Some systems use a special class of block codes called Low Density Parity Check (LDPC) codes. LDPC codes are described, for example, by Gallager, in "Low Density Parity Check Codes," MIT Press, 1963, which is incorporated herein by reference. Chapter 4 of this book describes decoding of LDPC codes. Lin and Costello describe iterative algorithms for decoding LDPC codes, as well as several example decoder configurations, in "Error Control Coding," Prentice Hall, second edition, June, 2004, Chapter 17.6, pages 871-880, which is incorporated herein by reference.

PCT International Publication WO 2009/072103, whose disclosure is incorporated herein by reference, describes a method for decoding Flash memory cells that are error-correction-coded as a unit. The method includes providing a hard-decoding success indication indicating whether or not hard-decoding is at least likely to be successful; and soft-decoding the plurality of flash memory cells at a first resolution only if the hard-decoding success indication indicates that the hard-decoding is not at least likely to be successful.

SUMMARY OF THE INVENTION

An embodiment of the present invention provides a decoding apparatus, including:

a decoder, which includes circuitry that is configured to decode an Error Correction Code (ECC) by operating in one of:

a first operational mode having a first power consumption; and a second operational mode, in which at least part of the circuitry that is active during the first operational mode is deactivated, and which has a second power consumption that is lower than the first power consumption; and a control unit, which is configured to evaluate a criterion with respect to an input code word, to select one of the first and second operational modes responsively to the criterion, and to invoke the decoder to decode the input code word using the selected operational mode.

In some embodiments, the control unit is configured to initially invoke the decoder to decode the input code word using the second operational mode, and, responsively to a failure in decoding the input code word using the second operational mode, to invoke the decoder to decode the input code word using the first operational mode. In another embodiment, the control unit is configured to make a prediction whether the second operational mode is likely to succeed in decoding the input code word, and to select the one of the operational modes based on the prediction. The control unit may be configured to make the prediction responsively to a success of the second operational mode in decoding one or more previous code words.

In a disclosed embodiment, the circuitry includes first circuitry that is configured to decode the ECC in the first operational mode, and second circuitry that is configured to decode the ECC in the second operational mode, and the control unit is configured to deactivate the first circuitry during the second operational mode, and to deactivate the second circuitry during the first operational mode. In an embodiment, the decoder is configured to decode the ECC by processing soft metrics when operating in the first operational mode, and by processing hard metrics when operating in the second operational mode. In another embodiment, the decoder is configured to decode the ECC by processing first soft metrics represented at a first quantization level when operating in the first operational mode, and by processing second soft metrics represented at a second quantization level, coarser than the first quantization level, when operating in the second operational mode. Typically, the decoder is configured to decode the ECC at a first decoding speed when operating in the first operational mode, and at a second decoding speed, lower than the first decoding speed, when operating in the second operational mode.

In some embodiments, the decoder and the control unit are included in a memory controller that stores data in a memory including multiple memory cells, and the input code word is read from a group of the memory cells. In some embodiments, the criterion depends on a wear level of the group of the memory cells and/or on a distortion level in the group of the memory cells. In an embodiment, the ECC is defined by a set of parity check equations, and the criterion depends on a number of the parity check equations that are met by the input code word.

In another embodiment, the circuitry is configured to decode the ECC word by processing soft metrics in a soft decoding process when operating in the first operational mode, by processing hard metrics in a hard decoding process when operating in the second operational mode, and by processing the hard metrics in the soft decoding process when operating in a third operational mode, and the control unit is configured to cause the decoder to decode the input code word using one of the first, second and third operational modes responsively to the criterion. In an embodiment, the control unit is configured to initially invoke the decoder to decode the input code word using the second operational mode, to invoke the decoder to decode the input code word using the third operational mode responsively to a failure in decoding the input code word using the second operational mode, and to invoke the decoder to decode the input code word using the first operational mode upon failing to decode the input code word using the third operational mode.

In some embodiments, the input code word is stored in a given page in the memory, the decoder includes a metric calculation unit, which is configured to cache the given page and one or more additional pages read from the memory and to compute metrics for decoding the input code word based on the cached given page and additional pages, and the circuitry is configured to decode the input code word using the metrics. The additional pages may include a first page type, which is stored in another group of the memory cells that potentially causes interference to the group of the memory cells, a second page type, which is stored in the group of the memory cells together with the given page, a third page type, which includes a version of the given page that is re-read using read thresholds that are different from the given page, and/or a fourth page type, which includes a copy of the given page that is re-read using the same read thresholds as the given page.

In another embodiment, the input code word is read from the group of the memory cells using one or more read thresholds, and the decoder is configured to decode the input code word by applying an iterative process that iteratively flips bits of the input code word, to count a first number of first events in which any of the bits is flipped from "0" to "1", to count a second number of second events in which any of the bits is flipped from "1" to "0", and to compute an adjustment for application to at least one of the read thresholds based on the first and second numbers. In yet another embodiment, the decoder and the control unit are included in a communication receiver that receives a communication signal including the input code word.

There is additionally provided, in accordance with an embodiment of the present invention, a decoding method, including:

operating a decoder, which includes circuitry that decodes an Error Correction Code (ECC) by operating in one of:
 a first operational mode having a first power consumption; and
 a second operational mode, in which at least part of the circuitry that is active during the first operational mode is deactivated, and which has a second power consumption that is lower than the first power consumption;
evaluating a criterion with respect to an input code word;
selecting one of the first and second operational modes responsively to the criterion; and
invoking the decoder to decode the input code word using the selected operational mode.

The present invention will be more fully understood from the following detailed description of the embodiments thereof, taken together with the drawings in which:

DETAILED DESCRIPTION OF EMBODIMENTS

Overview

Embodiments of the present invention that are described hereinbelow provide improved decoder configuration and associated methods for decoding Error Correction Codes (ECC). In some embodiments, an input ECC code word is decoded by a pair of ECC decoders. One decoder ("the first decoder") has a high error correction capability, but on the other hand has relatively high power consumption. The other decoder ("the second decoder") has low power consumption and is typically faster than the first decoder, but on the other hand has only modest error correction capability. In a typical flow, the decoding process initially attempts to decode the code word using the second decoder. If the initial attempt fails, the code word is decoded using the first decoder.

Using this technique, most code words are typically decoded successfully in the initial attempt, and only few code words that suffer from a large number of errors are handled by the higher-performance decoder. As a result, the average power consumption is reduced and the average decoding speed (throughput) is increased, without compromising error correction performance. In other words, the disclosed configurations achieve a decoding speed and power consumption that are comparable to those of the second decoder, and at the same time achieve the error correction capability of the first decoder.

In some embodiments, the first and second decoders are viewed as a dual decoder that operates in one of two operational modes. In these embodiments, a control unit configures the dual decoder to operate in the desired mode, i.e., invokes the first or second decoder to decode a given ECC code word, as appropriate. In some embodiments, the first and second decoders are implemented using separate circuitry; each decoder is activated during one operational mode and deactivated during the other mode. In these embodiments, each of the two decoders may run an entirely different type of decoding scheme. The structure of each decoder can be optimized for the specific decoding scheme, irrespective of the other decoder. In other embodiments, the first and second decoders may share some circuitry. In either case, at least part of the circuitry of the first decoder is deactivated when using the second decoder, so as to reduce power consumption.

In some embodiments, the first decoder comprises a soft decoder that operates on soft metrics, and the second decoder comprises a hard decoder that operates on hard metrics. In alternative embodiments, the first and second decoders both comprise soft decoders, but the first decoder operates on soft metrics that are represented at a higher quantization level (e.g., represented by a larger number of bits) than the soft metrics used by the second decoder.

In some embodiments, the disclosed techniques are implemented in a memory system that reads ECC-encoded pages from a memory. In an example embodiment, a metric calculation unit computes hard or soft metrics for use by the first and second decoders. An example configuration of such a unit, which computes soft metrics based on multiple read results of multiple pages, is described herein.

Although the embodiments described herein refer mainly to Low Density Parity Check (LDPC) codes, the disclosed techniques are applicable to various other types of ECC. The embodiments described herein focus on ECC decoding that is implemented in a memory controller as part of a data storage application. Alternatively, the disclosed techniques can be used in various other applications, such as in communication receivers.

System Description

Figure 1:
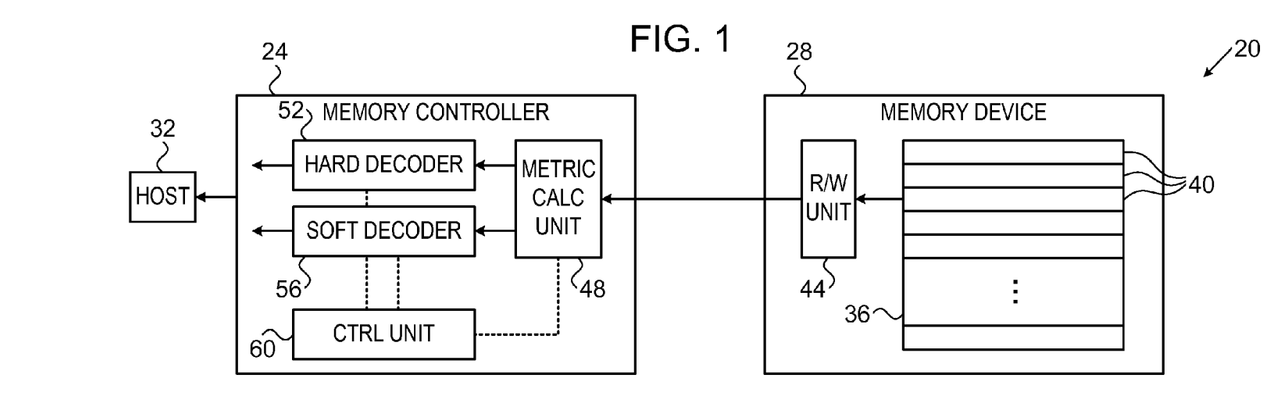
FIGS. 1 and 2 are block diagrams that schematically illustrate memory systems, in accordance with embodiments of the present invention.

FIG. 1 is a block diagram that schematically illustrates a memory system 20, in accordance with an embodiment of the present invention. System 20 comprises a memory controller 24, which stores data in a memory device 28 for a host 32. In particular, the memory controller encodes the data for storage using an Error Correction Code (ECC), and decodes the ECC of the data read from the memory device. FIG. 1 shows only the elements of system 20 that are involved in the readout and decoding process, for the sake of clarity.

Memory device 28 comprises a memory array 36, which comprises a plurality of analog memory cells. Array 36 is partitioned into multiple memory pages 40. Each page 40 is stored in a group of analog memory cells. In some embodiments, a given group of memory cells may store two or more pages. A Read/Write (R/W) unit 44 stores data in the memory cells of array 36, and reads data from the memory cells.

The memory cells in array 36 may comprise, for example, NAND, NOR or Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM), Dynamic RAM (DRAM) cells, and/or any suitable type of analog memory cells. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

In the context of the present patent application and in the claims, the term "analog memory cell" is used to describe any memory cell that holds a continuous, analog value of a physical parameter, such as an electrical voltage or charge. Any suitable type of analog memory cells, such as the types listed above, can be used. In the present example, memory device 28 comprises a non-volatile memory of NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. The memory cells are typically arranged in rows and columns. Typically, a given memory device comprises multiple erasure blocks (also referred to as memory blocks), i.e., groups of memory cells that are erased together. Memory device 28 may comprise a packaged device or an unpackaged semiconductor chip or die. In the present example, system 20 comprises a single memory device 28 having a single memory array 36. Alternatively, however, the system may comprise multiple memory devices, each comprising one or more memory arrays.

The data that is stored by memory controller 24 in memory device 28 is encoded with an Error Correction Code (ECC) in order to increase the storage reliability of the data and reduce the likelihood of read errors. In the embodiments described herein, the ECC comprises a Low Density Parity Check (LDPC) code. Alternatively, however, any other suitable type of ECC, such as Bose-Chaudhuri-Hocquenghem (BCH) codes, Reed Solomon codes and Turbo codes, can be used. Typically, the memory controller partitions the data received from host 32 into data pages, encodes each data page with the ECC so as to produce an ECC code word, and stores each code word in a respective page 40 in device 28. When reading data from the memory device, the memory controller typically reads each page 40, decodes the code word and provides the decoded data to host 32.

Memory controller 24 in may be implemented in hardware. Alternatively, the memory controller may comprise a microprocessor that runs suitable software, or a combination of hardware and software elements. In some embodiments, memory controller 24 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The configuration of FIG. 1 is an example system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figures for clarity. In the example configuration shown in FIG. 1, memory device 28 and memory controller 24 are implemented as separate Integrated Circuits (ICs). In alternative embodiments, however, the memory device and memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory device is disposed. Further alternatively, some or all of the functionality of the memory controller can be implemented in software and carried out by a processor or other element of host 32. In some embodiments, the host and the memory controller may be fabricated on the same die, or on separate dies in the same device package.

In an example configuration, the memory cells in array 36 are arranged in multiple rows and columns. The memory cells in each row are connected by word lines, and the memory cells in each column are connected by bit lines. As noted above, the memory array is typically divided into multiple pages 40, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Data Readout and ECC Decoding Using Dual ECC Decoder

The ECC decoding performance of memory controller 24 has a considerable effect of the entire readout performance of system 20. In particular, the power consumption of the ECC decoding process is often a major contributor to the overall power consumption of the memory controller. Additionally, the ECC decoding speed of the memory controller has a significant impact on the overall readout throughput of the system.

In some embodiments of the present invention, memory controller 24 comprises a dual ECC decoder, which is able to decode LDPC code words using two different decoding processes. One process has a high error correction capability, but on the other hand has relatively high power consumption. The other process has low power consumption and is typically faster than the first process, but on the other hand has only modest error correction capability. By appropriately selecting when to apply each process, memory controller 24 can jointly achieve low power consumption and high readout throughput. The disclosed techniques may reduce both the peak and the average power consumption of the ECC decoding process.

In the configuration of FIG. 1, the two decoding processes comprise a hard decoding process and a soft decoding process. Each of these processes accepts as input a set of storage values corresponding to a given memory page (i.e., to a given LDPC code word), generates a respective metric for each storage value in the set, and attempts to decode the code word based on the metrics.

In the present context, the term "hard metrics" means binary metrics that are quantized to a single bit. The term "soft metrics" means metrics that are quantized to more than a single bit. Soft metrics may comprise, for example, a respective Log Likelihood Ratio (LLR) for each bit in the code word. The term "hard decoding" means a decoding process whose operations (e.g., passing messages between decoder nodes in an iterative process) are performed using single bit quantization. The term "soft decoding" means a decoding process whose operations are performed using a quantization of more than a single bit. It is important to distinguish between the classification of the decoding process as soft or hard, and the classification of the metrics as soft or hard. In other words, a soft decoder may be applied to soft metrics, but may alternatively be applied to hard metrics. An example method that uses these two modes of operation is described in FIG. 4 below.

Memory controller 24 may apply any suitable hard and soft LDPC decoding processes, which are often iterative. For example, the hard decoding process may comprise a bit-flipping process. The soft decoding process may comprise, for example, a Belief Propagation (BP) process, which is also referred to as a Sum-Product Algorithm (SPA). Hard and soft decoding processes of this sort are described in the Lin and Costello book, cited above, by Gallager, in "Low-Density Parity-Check Codes," IRE Transactions on Information Theory, January, 1962, pages 21-28, by Wu et al., in "Parallel Weighted Bit-Flipping Decoding," IEEE Communications Letters, volume 11, number 8, August, 2007, pages 671-673, which is incorporated herein by reference, and in U.S. Pat. No. 6,938,196, whose disclosure is incorporated herein by reference.

Typically, the soft decoding process has a higher error correction capability than a hard decoding process, but on the other hand it is typically slower and consumes more power. A bit-flipping decoder, for example, processes binary metrics and is therefore considerably simpler and faster than a BP decoder that processes multi-bit LLRs. The logic and memory circuitry of a bit-flipping decoder is also considerably smaller and simpler than the circuitry of a BP decoder. As a result, a bit-flipping decoder typically consumes much less power than a BP decoder. On the other hand, the error correction capability of a BP decoder is typically superior to that of a bit-flipping decoder.

In some embodiments, the hard decoding process can be applied to correct (typically small) error floor patterns that the soft decoding process is unable to correct. In some practical cases, the soft decoding process may have a certain error floor caused by error patterns having a small number of errors. If the hard decoding process is insensitive to this specific pattern, it can be applied to the results of the soft decoding process.

In the embodiment of FIG. 1, memory controller 24 comprises a metric calculation unit 48, a hard decoder 52, a soft decoder 56 and a control unit 60. Unit 48 accepts the read results of a given page from R/W unit 44 of memory device 28, and computes respective hard and/or soft metrics for the read results. The hard metrics typically comprise a 1-bit value for each bit in the code word. The soft metrics typically comprise LLR for each bit in the code word, although any other suitable type of soft metrics can be used. The metrics generated by unit 48 are used as input by decoders 52 and 56. Control unit manages the readout and decoding process, and in particular controls unit 48 and decoders 52 and 56.

When reading a given page 40 containing an LDPC code word, control unit 60 typically evaluates a certain criterion with respect to the code word. Based on the criterion, unit 60 selects whether to decode the LDPC code word using hard or soft decoding, and invokes one of decoders 52 and 56 accordingly. Any suitable criterion can be used for this purpose. In an example embodiment, the control unit first attempts to decode the code word using hard decoding by invoking decoder 52. If the hard decoding attempt fails, the control unit attempts to decode the code word using soft decoding by invoking soft decoder 56. In an alternative embodiment, control unit 60 predicts whether hard decoding is likely to succeed or not. If hard decoding is likely to succeed, unit 60 invoked hard decoder 52. Otherwise, unit 60 invokes soft decoder 56.

Further alternatively, the memory controller may select between the decoders using any other suitable selection criterion. For example, the criterion may depend on the wear level of the memory cells that store the code word in question, e.g., on the number of Programming and Erasure (P/E) cycles applied to these memory cells. In particular, the criterion may depend on the proximity or the amount of overlap between the threshold voltage distributions of different programming states. For fresh memory cells, hard decoding may be sufficient with high likelihood. For heavily-cycled memory cells, e.g., above a predefined number of P/E cycles, soft decoding may be needed.

Figure 2:
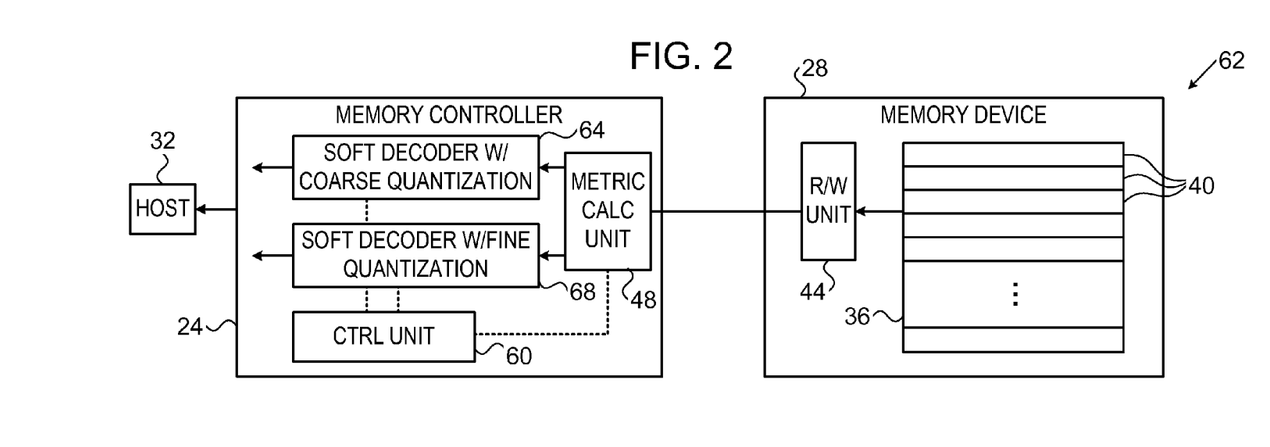

FIG. 2 is a block diagram that schematically illustrates a memory system 62, in accordance with an alternative embodiment of the present invention. In this embodiment, the two decoding processes applied by memory controller 24 are soft, and differ from one another in the quantization level of the soft metrics. In the present example, memory controller 24 comprises a coarse-quantization decoder 64, and a fine-quantization decoder 68. Decoder 64 operates on soft metrics (e.g., LLRs) that are represented at a certain quantization, e.g., using a certain number of bits. Decoder 68 operates on soft metrics that are represented at a lower quantization (e.g., using less bits) than the soft metrics used by decoder 64. The higher quantization level of decoder 64 can be used to represent the metrics with a finer precision, and/or to achieve higher saturated values.

Since the computations in decoder 68 are typically more exact than the computations in decoder 64, decoder 68 typically has a higher error correction capability. On the other hand, decoder 68 is typically slower and consumes more power than decoder 64. (The difference in quantization between decoders 64 and 68 applies both to the decoder inputs and to the internal processing of the metrics in the decoders. Thus, coarse-quantization decoder 64 typically has smaller and simpler logic and memory circuitry than decoder 68. As a result, the decoder 64 typically consumes less power than decoder 68.) In an example embodiment, decoder 64 operates on 4-bit LLRs, whereas decoder 68 operates on 8-bit LLRs. Alternatively, however, any other suitable metric quantization levels can be used.

In each of systems 20 and 62, the two decoders are implemented using certain circuitry. The term "circuitry" refers to hardware implementation, software implementation, and hybrid hardware-software implementation. In some embodiments, the two decoders (hard/soft or coarse/fine quantization decoders) are implemented using separate and independent circuitry. This technique enables each decoder to apply an entirely different decoding process, and to be optimized per its respective decoding process.

Implementing each of the decoders using separate circuitry is advantageous in various scenarios. For example, in an iterative hard LDPC decoder, messages processed by the decoder nodes are only 1-bit wide, so they can be stored in registers and not in memory, and all messages can be accessed in parallel. This configuration, which reduces the power consumption and increases the throughput of the hard decoder, is typically not feasible in soft decoders. Generally, a hard decoder can often be implemented using registers with little or no memory, whereas a soft decoder often requires the use of memory areas.

As another example, iterative LDPC decoders can be implemented using two possible configurations, referred to as "serial V" and "serial C" configurations. Serial V and Serial C decoder configurations are described, for example, by Sharon and Litsyn, in "Efficient Serial Message-Passing Schedules for LDPC Decoding," IEEE Transactions on Information Theory, volume 53, number 11, November, 2007, pages 4076-4091, which is incorporated herein by reference. Both configurations have variable nodes and check nodes that are updated iteratively. In a serial V configuration, the decoder updates the variable nodes one-by-one. After each variable node update, the decoder updates all the check nodes accordingly. In a serial C configuration, the decoder updates the check nodes one-by-one. After each check node update, the decoder updates all the variable nodes accordingly. Typically, the serial V configuration is superior to the serial C configuration for implementing hard decoders, in terms of power consumption and latency. Soft decoders, on the other hand, typically perform better when implemented using the serial C configuration. Implementing both configurations using shared circuitry is typically impractical. Thus, in some embodiments hard decoder 52 comprises a serial V iterative decoder, soft decoder 56 comprises a serial C iterative decoder, and the two decoders are implemented using separate and independent circuitry.

As yet another example, implementing the two decoders using separate circuitry is also advantageous because it enables them to operate in parallel, at least partially. For example, one decoder may decode a given code word, while the other decoder is in the process of decoding another code word. In an example embodiment, the hard decoder may attempt to decode a given code word. If hard decoding fails, the code word is decoded by the soft decoder. While the soft decoder is in the process of decoding the code word, the hard decoder may begin to attempt decoding another code word. This sort of pipelined operation reduces the overall decoding latency.

Implementing the two decoders using separate circuitry may also be advantageous if the logic required for selectively deactivating parts of the circuitry is large or complex. In other words, implementing two separate decoders may be more cost effective than implementing a dual-mode decoder with shared circuitry, in terms of gate count and physical size. This advantage is particularly significant when one decoder is considerably smaller and simpler than the other, such as for some hard and soft decoders. In some embodiments, the system comprises multiple hard decoders and one or more soft decoders. The hard decoders are operated in parallel to decode multiple code words, and thus achieve high readout throughput. If a given hard decoder fails to decode a given code word, a soft decoder is invoked to decode it. In practice, since most code words are decodable using hard decoding, a small number of soft decoders (or even a single soft decoder) is sufficient for operating in conjunction with a large number of hard decoders.

In alternative embodiments, however, some circuitry is shared by the two decoders. In the configuration of FIG. 2, for example, the coarse-quantization (e.g., O-bit) soft decoder can be implemented using a subset of the circuitry of the fine-quantization (e.g., 8-bit) soft decoder. In other words, the fine-quantization decoder can be operated as a coarse-quantization decoder by deactivating some of its circuitry.

In some embodiments, control unit 60 deactivates at least some circuitry of the higher-performance (and higher power consumption) decoder when applying the lower power consumption process. This feature reduces power consumption, and is applied irrespective of whether the circuitry of the two decoders is separate or shared. For example, in system 20 of FIG. 1, the control unit may deactivate soft decoder 56 when using hard decoder 52. In system 62 of FIG. 2, the control unit may deactivate fine-quantization decoder 68 when using coarse-quantization decoder 64.

The above-described circuitry deactivation can be viewed as operating the dual decoder in one of two operational modes. In the first operational mode, the control unit applies high-performance decoding. In the second operational mode, the control unit applies lower-power and faster (but lower-performance) decoding. When operating in the second mode, the control unit deactivates at least some of the circuitry used in the first mode.

The decoder types used in the system configurations of FIGS. 1 and 2 are shown purely by way of example. In alternative embodiments, the memory controller may apply any other suitable ECC decoding processes that provide different trade-offs between power consumption, throughput (decoding speed) and error correction capability.

In some embodiments, the memory controller comprises more than two (e.g., three or four) decoders, and the control unit selects one of these decoders to decode a given code word using certain criteria. Although the embodiments described herein refer mainly to storage systems, the disclosed techniques can be used in other applications. For example, a communication receiver may receive ECC code words over a modulated signal. The receiver may comprise two (or more) decoders and a control unit, which decode the received code words using the methods described herein.

Figure 3:
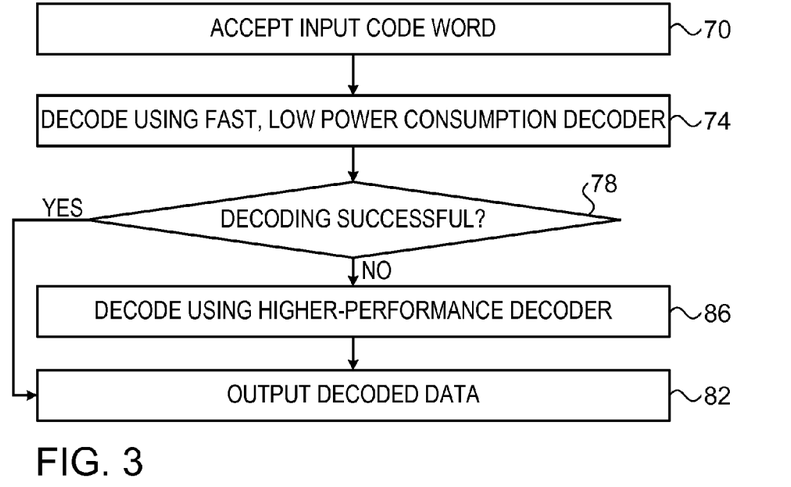
FIG. 3 is a flow chart that schematically illustrates a method for ECC decoding, in accordance with an embodiment of the present invention.

FIG. 3 is a flow chart that schematically illustrates a method for ECC decoding, in accordance with an embodiment of the present invention. The method begins with memory controller 24 accepting an input code word read from memory device 28, at an input step 70. The memory controller initially attempts to decode the input code word using the faster, lower power consumption decoder (e.g., decoder 52 of FIG. 1 or decoder 64 of FIG. 2), at an initial decoding step 74. The memory controller checks whether the initial decoding attempt was successful, at a success checking step 78. If successful, the memory controller outputs the decoded data to host 32, at an output step 82, and the method terminates. Otherwise, the memory controller decodes the input code word using the higher-performance decoder (e.g., decoder 56 of FIG. 1 or decoder 68 of FIG. 2), at a subsequent decoding step 86. The memory controller then outputs the decoded data to the host, at output step 82.

In alternative embodiments, the memory controller does not necessarily start by attempting the faster, lower power consumption decoder for every code word. For example, the memory controller may try to predict whether the faster, lower power consumption decoder is likely to succeed in decoding the given code word. If the faster, lower power consumption decoder is unlikely to succeed, the memory controller invokes the higher-performance decoder without trying the lower power consumption decoder first.

In these embodiments, the memory controller may use any suitable criterion in order to predict whether the faster, lower power consumption decoder is likely to succeed. For example, if one or more code words that were previously read from the same erasure block as the present code word required the use of the higher-performance decoder, the memory controller may decide to initially invoke the higher-performance decoder for the present code word, as well. (In a communication receiver, the higher-performance decoder may be invoked if one or more code words from the same packet were not decoded successfully using the faster, lower power consumption decoder.)

As another example, the memory controller may estimate the level of distortion in the group of memory cells from which the code word was read, and choose the decoder for decoding the code word depending on the estimated distortion. Typically, low distortion (e.g., low Signal to Noise Ratio—SNR) may enable using the faster, lower power consumption decoder, while high distortion may require the higher-performance decoder. The distortion in the memory cells may be due to cross-coupling interference from other memory cells in array 36, or to any other reason. Example methods for estimating distortion levels in analog memory cells are described, for example, in U.S. Patent Application Publications 2008/0198650 and 2009/0024905, and in PCT International Publication WO 2008/026203, whose disclosures are incorporated herein by reference.

As yet another example, the memory controller may choose the appropriate decoder based on the number of parity check equations that are fulfilled by the bits of the input code word. If a large number of parity check equations are fulfilled before decoding begins, the number of errors is likely to be small. In such a case, the faster, lower power consumption decoder may be sufficient. If a large number of parity check equations are not fulfilled, it may be required to invoke the higher-performance decoder. Additional aspects of parameter estimation based on the number of fulfilled parity check equations are addressed in U.S. patent application Ser. No. 12/364,531, which is assigned to the assignee of the present patent application and whose disclosure is incorporated herein by reference.

Figure 4:
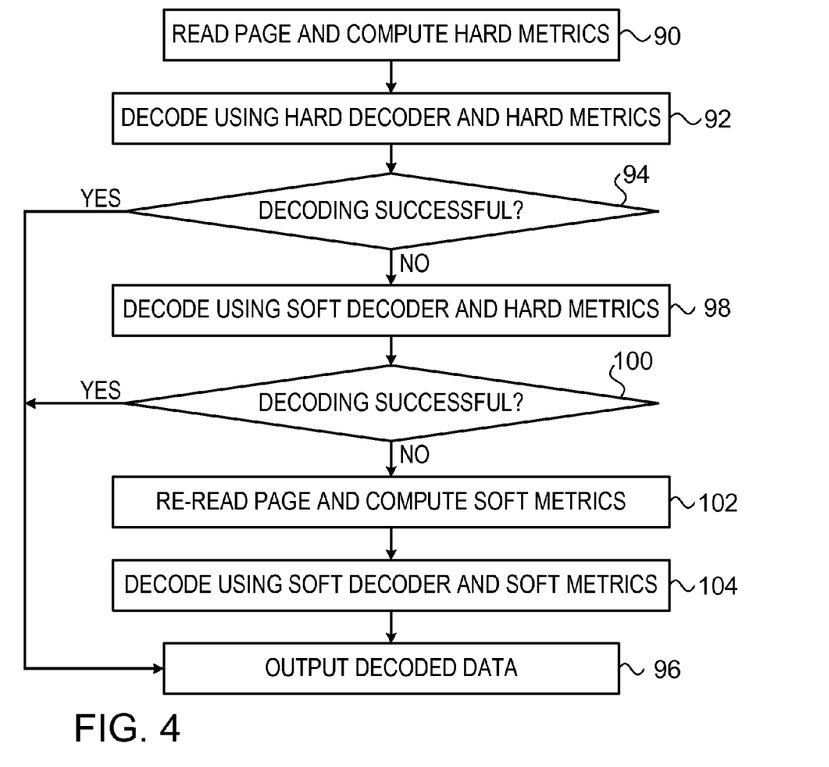
FIG. 4 is a flow chart that schematically illustrates a method for data readout and ECC decoding, in accordance with an embodiment of the present invention.

FIG. 4 is a flow chart that schematically illustrates a method for data readout and ECC decoding, in accordance with an embodiment of the present invention. Typically, R/W unit 44 reads a given page 40 by comparing the threshold voltages of the memory cells that store this page to one or more read thresholds. In some embodiments, system 20 computes soft metrics for the bits of a given page (code word) by reading the page twice or more using different read thresholds. Example methods for computing soft metrics using multiple read operations are described, for example, in PCT International Publications WO 2007/132457, WO 2008/053472 and WO 2008/139441, and in U.S. Patent Application Publication 2009/0106485, whose disclosures are incorporated herein by reference.

In the method of FIG. 4, memory controller 24 produces hard metrics by performing a single read operation using a certain set of read thresholds. The memory controller produces soft metrics by performing one or more additional read operations with different sets of read thresholds, and producing a metric for each bit based on the corresponding multiple readout results of this bit. The method of FIG. 4 defines three operational modes:

Applying the hard decoder to hard metrics.
    Applying the soft decoder to the same hard metrics, without additional read operations.
    Applying the soft decoder to soft metrics.

In other words, the method of FIG. 4 defines an intermediate mode between fully-hard and fully-soft decoding. This intermediate mode (soft decoder operating on hard metrics) provides higher error correction performance than fully-hard decoding, without requiring additional read operations.

The method begins with memory controller 24 reading a given page (code word) using a certain set of read thresholds and computing hard metrics based on the read results, at a hard readout step 90. The memory controller then decodes the code word by applying hard decoder 52 (FIG. 1) to the hard metrics, at a first decoding step 92. The memory controller checks whether the code word was decoded successfully, at a first checking step 94. If decoding was successful, the memory controller outputs the decoded data to host 32, at a data output step 96.

Otherwise, memory controller 24 applies soft decoder 56 to the hard metrics, at a second decoding step 98. Note that this step applies the soft decoder to the same hard metrics used by the hard decoder at step 92 above. Therefore, step 98 does not require any additional readout operations. Memory controller 24 checks whether decoding was successful, at a second checking step 100. If successful, the memory controller outputs the decoded data to the host at data output step 96.

Otherwise, memory controller 24 re-reads the page (at least once) using different read thresholds, and computes soft metrics based on the multiple read results, at a re-reading step 102. This step may comprise one or more re-read operations. Each additional read operation enhances the information as to the actual threshold voltages of the memory cells, and therefore refines the soft metrics. On the other hand, each additional read operation increases the readout time and power consumption. Memory controller 24 applies soft decoder 56 to the soft metrics, at a third decoding step 104. Assuming decoding is successful, the memory controller outputs the decoded data at data output step 96.

In some embodiments, decoding at step 104 may fail even though the memory controller uses soft metrics. In these embodiments, steps 100-104 can be repeated iteratively, until decoding is successful. In each iteration, the memory controller re-reads the page using additional read thresholds, refines the soft metrics based on the additional read results, and re-attempts to decode the code word.

Example Metric Calculation Unit Configuration

Figure 5:
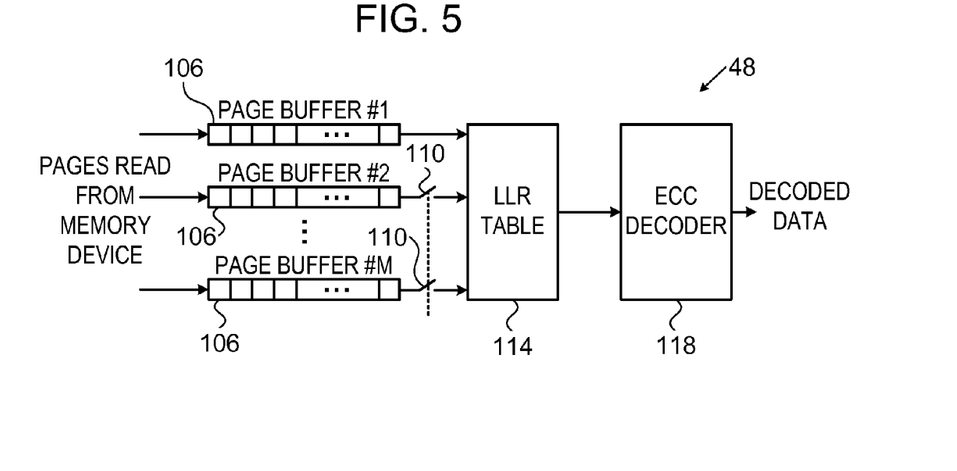
FIG. 5 is a block diagram that schematically illustrates a metric calculation unit, in accordance with an embodiment of the present invention.

FIG. 5 is a block diagram that schematically illustrates metric calculation unit 48, in accordance with an example embodiment of the present invention. In the embodiment of FIG. 5, unit 48 comprises two or more page buffers 106, denoted #1 . . . #M. Each page buffer can cache the content of a given memory page 40, which was read from memory device 28. Corresponding bits of the page buffers are used as an index to an LLR Look-Up Table (LUT) 114. The page buffers are connected to the LLR LUT via switches 110, which are controlled by control unit 60. Control unit 60 also determines which page is cached in each page buffer. In some embodiments, page buffer #1 is connected to the LLR LUT permanently, without a switch.

When reading and decoding a given page (referred to as a target page), control unit 60 caches the read results of the target page in page buffer #1. In addition, control unit 60 may cache read results of one or more other pages that affect the metrics of the target page in other page buffers. As will be explained below, unit 48 computes the LLRs of the bits of the target page based on the multiple read results that are cached in page buffers 106, not only based on the target page itself. As such, the LLRs computed by unit 48 can be refined to take into account valuable information from other pages that may affect the target page.

For example, unit 60 may cache in page buffers 106 one or more neighboring pages that potentially cause interference to the target page. Additionally or alternatively, unit 60 may cache one or more re-read results of the target page, which were read using different read thresholds. Further additionally or alternatively, unit 60 may cache in page buffers 106 one or more pages that are stored in the same group of memory cells as the target page.

For example, in an MLC device, the same group of memory cells typically stores two or more pages in different MLC bits of the memory cells. In four-level MLC device that stores 2 bits/cell, for example, a group of memory cells can store one page in the Least Significant Bits (LSBs) of the memory cells, and another page in the Most Significant Bits (MSBs) of the memory cells. These pages are referred to as an LSB page and a MSB page, respectively. When reading the MSB page from a given group of memory cells, unit 60 can cache the LSB page of that group in the page buffers, and vice versa. These pages can be used to enhance the metrics of the LSB page based on the data of the MSB page, and vice versa.

For example, when reading the MSB page, different metrics can be assigned to MSB page bits whose corresponding LSB page bits are "0", and to MSB page bits whose corresponding LSB page bits are "1". Similarly, when reading the LSB page, different metrics can be assigned to LSB page bits whose corresponding MSB page bits are "0", and to LSB page bits whose corresponding MSB page bits are "1". This technique is demonstrated further below.

Generally, when reading a certain target page, page buffers 106 may contain any desired combination of one or more re-read results of the target page, read results of potentially-interfering neighboring pages, and/or read results of pages that reside in the same memory cells as the target page.

LLR LUT 114 can be configured to take into account the effects of the different cached pages on the LLRs of the target page. (Although the description that follows focuses on LLRs, the disclosed technique can be used with other sorts of soft metrics, as well.)

Typically, the LUT is configured to output a respective LLR value for each combination of one or more bit values at its input. The LLRs produced by LUT 114 are provided to an ECC decoder 118, which decodes the target page by processing the LLRs. Decoder 118 may comprise a soft decoder, or a dual decoder as described in FIGS. 1 and 2 above.

When only page buffer #1 is connected to the LLR LUT, the LUT typically calculates hard metrics: For each bit of the target page, the LUT outputs a certain output value (typically a large negative value) if the bit value is "0" and another output value (typically a large positive value) if the bit value is "1". If one or more additional pages are connected to the LUT using switches 110, the LUT produces soft metrics that depend on these values. In each cycle, a given bit of the target page and the corresponding bits in the other cached pages are provided in parallel as a multi-bit index to LUT 114. For each bit value combination, the LUT outputs a respective LLR value.

By configuring the LUT appropriately, unit 48 can produce LLRs that take into account soft readout (i.e., multiple readout of the target page using different read thresholds), interference from neighboring pages, and/or effects of other pages residing in the same group of memory cells as the target page. LUT 114 is typically programmed by control unit 60. The setting of switches 110, the identity of the pages cached in buffers 106 and/or the contents of LUT 114 can be modified by control unit 60 as desired. For example, when carrying out the methods of FIG. 3 or FIG. 4, unit 60 can configure the page buffers, switches and LUT in unit 48 to calculate hard or soft metrics, as required at each stage of the decoding process.

In some embodiments, unit 48 computes soft metrics, in the present example LLRs, using multiple read results of the target page that are cached in page buffers 106.

Figure 6:
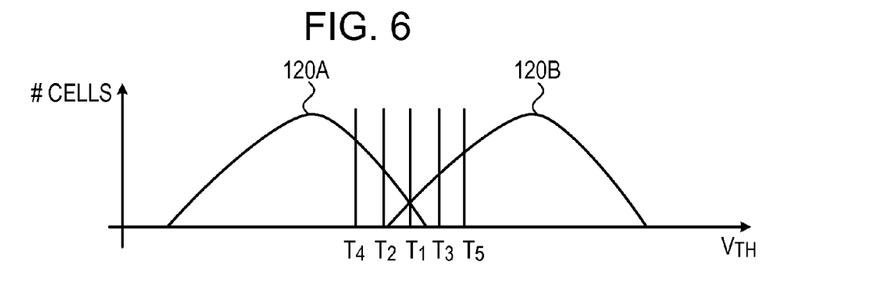
FIGS. 6 and 7 are graphs showing threshold voltage distributions and read thresholds in a group of analog memory cells, in accordance with embodiments of the present invention.

FIG. 6 is a graph showing threshold voltage distributions and read thresholds in a group of analog memory cells, in accordance with an embodiment of the present invention. In the example of FIG. 6, the group of memory cells stores an LDPC code word in a given target page. Each memory cell in the group is programmed to one of two programming levels, so as to store one bit of the code word. The threshold voltages of the cells in the two programming levels are distributed according to distributions 120A and 120B, respectively. Five read thresholds denoted $T_1 \ldots T_5$ are used for computing LLRs for decoding the code word.

Unit 48 of FIG. 5 above may compute the LLRs based on any desired subset of these read thresholds. In some embodiments, the LLRs are refined iteratively by adding more read results based on more read thresholds, until the code word is decoded successfully.

For example, unit 48 can compute LLRs based on three read thresholds $T_1 \ldots T_3$ by configuring page buffers 106, switches 110 and LUT 114 as follows:

Load the read results obtained using read thresholds $T_1 \ldots T_3$ into page buffers #1 . . . 3, respectively.

Connect the switches corresponding to these page buffers to LUT 114, and disconnect the other switches.

Configure LUT 114 with appropriate LLR values corresponding to the different threshold voltage ranges defined by read thresholds $T_1 \ldots T_3$. For example, read results that are below $T_2$ or above $T_3$ have a relatively high confidence level. Read results that are between $T_2$ and $T_3$ have a lower confidence level.

Using this configuration, LUT 114 will output LLR values that reflect the confidence level of each bit, based on the read results using read thresholds $T_1 \ldots T_3$. As another example, unit 48 can compute LLRs based on all five read thresholds $T_1 \ldots T_5$ by configuring page buffers 106, switches 110 and LUT 114 as follows:

Load the read results obtained using read thresholds $T_1 \ldots T_5$ into page buffers #1 . . . 5, respectively.

Connect the switches corresponding to these page buffers to LUT 114, and disconnect the other switches.

Configure LUT 114 with appropriate LLR values corresponding to the different threshold voltage ranges defined by read thresholds $T_1 \ldots T_5$. For example, read results that are below $T_4$ or above $T_5$ have a relatively high confidence level. Read results that are between $T_4$ and $T_2$, or between $T_3$ and $T_5$, have a lower confidence level. Read results that are between $T_2$ and $T_3$ have an even lower confidence level.

As noted above, in a MLC device, unit 48 can compute the LLRs in a manner that takes into account read results of other pages that are stored in the same group of memory cells as the target page.

In the example of FIG. 5, the five read thresholds are positioned optimally in the boundary region between distributions 120A and 120B. In some cases, however, the read thresholds may not be positioned optimally, and this deviation may degrade the read performance and even prevent successful decoding. In some embodiments, memory controller 24 detects that one or more of the read thresholds are not positioned optimally, and modifies them in order to reach the optimal positions. For example, the memory controller may remove one or more of the read thresholds, add one or more read thresholds or shift the positions of one or more read thresholds. After this modification, some of the read results cached in buffers 106 may be updated to reflect the updated read thresholds.

In an alternative embodiment, if memory controller detects that one or more of the read thresholds are not positioned optimally, the memory controller may update LUT 114 according to the deviation of the read thresholds from the optimal position. Decoding can then be re-attempted using the updated metrics, without performing additional read operations.

Figure 7:
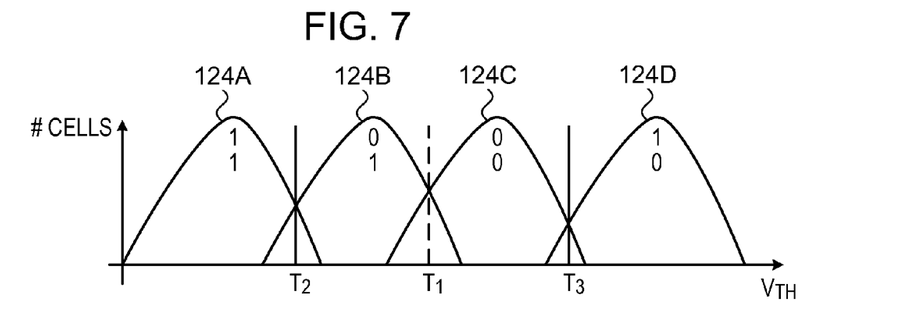

FIG. 7 is a graph showing threshold voltage distributions and read thresholds in a group of MLC, in accordance with an embodiment of the present invention. The example of FIG. 7 shows a group of four-level memory cells, which store two code words in two respective pages (referred to as an LSB page and an MSB page). Each memory cell in the group is programmed to one of four programming levels, corresponding to threshold voltage distributions 124A . . . 124D, respectively.

The bit values represented by each threshold voltage distribution are indicated in the figure, with the top bit value corresponding to the MSB and the bottom bit value corresponding to the LSB. The two pages are read using three read thresholds $T_1 \ldots T_3$. Read threshold $T_1$ is used for reading the LSB page—Memory cells whose threshold voltages are below $T_1$ are assumed to have LSB="1", and memory cells whose threshold voltages are above $T_1$ are assumed to have LSB="0". Read thresholds $T_2$ and $T_3$ are used for reading the MSB page—Memory cells whose threshold voltages are below $T_2$ or above $T_3$ are assumed to have MSB="1", and memory cells whose threshold voltages are between $T_2$ and $T_3$ are assumed to have MSB="0".

In some embodiments, unit 48 of FIG. 5 above caches the read results of both the LSB and MSB pages in buffers 110, and computes the LLRs of the MSB page based on the two cached pages. For example, the cached LSB page can be used to differentiate between MSB read results that are below $T_2$ and MSB read results that are above $T_3$. In an example embodiment, LUT 114 assigns the MSB read results that are below $T_2$ different LLRs from the MSB read results that are above $T_3$. This sort of differentiation cannot be performed using the MSB read results alone.

In some embodiments, unit 48 of FIG. 5 above adjusts the LLRs of the target page based on read results of one or more neighboring pages that cause interference (e.g., cross-talk) to the target page. Unit 48 performs this adjustment by caching the neighboring pages in page buffers 106 and configuring LUT 114 appropriately. In an embodiment, the bits in the target page that are subject to strong interference can be marked. For example, the bits in one of page buffers 106 can be set to "1" for the bits that suffer from strong interference, and to "0" for the other bits. LLR LUT 114 can be configured to reduce the confidence levels of the bits that suffer from strong interference. In an embodiment, unit 48 may cache two or more versions of a given neighboring page, which were read using different read thresholds. Using the multiple versions of the neighboring page, unit 48 can distinguish between different levels of interference that affect different bits of the target page, and account for the different interference levels when computing the metrics for the target page.

Additionally or alternatively, unit 48 of FIG. 5 may cache multiple read results of the target page, which were read using the same read thresholds. Re-reading the same page using the same read thresholds may produce different read results, for example due to random noise or Random Telegraph Signal (RTS) effects. Unit 48 may compute the soft metrics of the target page based on these multiple read results, such as by averaging them, by taking a majority vote or using any other suitable method. This feature can be embodied, for example, in LUT 114. Further aspects of computing soft metrics based on multiple read results of the target page and/or read results of neighboring pages are addressed in U.S. Patent Application Publication 2009/0024905, whose disclosure is incorporated herein by reference.

Read Threshold Adaptation Using Bit-Flip Counters

In some embodiments, one or both ECC decoders in memory controller 24 (e.g., decoder 52, 56, 64 or 68 in FIGS. 1 and 2 above) comprises an iterative LDPC decoder. In some iterative decoding processes, the decoder holds interim values of the bits of the code word. The bit values are typically initialized to the hard values of the input code word. The decoder then updates the bit values iteratively, until reaching final values that represent a valid code word. In some embodiments, the decoder updates the bit values in-place, and therefore does not retain the initial bit values (unless additional memory space is reserved for this purpose).

As noted above, the hard values of the input code word (the initial bit values) are obtained by reading the page in question using certain read thresholds. The difference between the initial and final values of the bits can be used as an indication whether these read thresholds are positioned correctly. Moreover, the difference also indicates whether the read thresholds should be increased or decreased.

Consider, for example, the LSB page in FIG. 7 above, which is read using read threshold $T_1$. Consider also two count values: Let $C_{0\to1}$ denote the number of bits in the code word whose initial value is "0" and whose final value is "1", i.e., the number of bits that have corrected from "0" to "1" during the iterative decoding process. Let $C_{1\to0}$ denote the number of bits in the code word whose initial value is "1" and whose final value is "0", i.e., the number of bits that have corrected from "1" to "0" during the iterative decoding process.

If $C_{0\to1}=C_{1\to0}$, then read threshold T1 is probably well-positioned. If $C_{0\to1}>C_{1\to0}$, then read threshold $T_1$ is most likely too low (in which case a relatively large number of bits whose true value is "1" were read incorrectly as "0", and were corrected by the code to "1"). If $C_{1\to0}>C_{0\to1}$, then read threshold $T_1$ is likely to be too high.

In order to count $C_{0\to1}$ and $C_{1\to0}$, however, the decoder should compare the initial and final values of the code word bits. This comparison typically involves storing the initial bit values, and thus increases the memory requirements of the decoder. The comparison may also add some latency to the decoding process.

In some embodiments, the LDPC decoder avoids the extra memory space and latency by counting bit flips (bit reversals) that occur during the decoding process, without storing the initial bit values. In an example embodiment, the decoder runs two counters denoted $F_{0\to1}$ and $F_{1\to0}$. Counter $F_{0\to1}$ counts the number of times that a bit was flipped from "0" to "1" during the iterative decoding process. Counter $F_{1\to0}$ counts the number of times that a bit was flipped from "1" to "0" during the iterative decoding process. In many cases, a given bit may change its value several times during the decoding process. Therefore, $F_{0\to1}$ may be larger than $C_{0\to1}$, and $F_{1\to0}$ may be larger than $C_{1\to0}$. Nevertheless, the difference between the two counters remains the same, i.e., $(F_{0\to1}-F_{1\to0})=(C_{0\to1}-C_{1\to0})$. As shown above, the adjustment that should be applied to read threshold $T_1$ depends on this difference, and not on the absolute counter values.

Thus, in some embodiments the decoder counts the number of "0"→"1" and "1"→"0" bit flips during the iterative decoding process by updating counters $F_{0\to1}$ and $F_{1\to0}$. When the decoding process is completed, the decoder calculates an adjustment that should be applied to read threshold $T_1$ based on $(F_{0\to1}-F_{1\to0})$. The memory controller may then adjust the read threshold accordingly.

As can be appreciated, this technique calculates the read threshold adjustment without storing the initial bit values of the code word. Moreover, since the $F_{0\to1}$ and $F_{1\to0}$ counters are updated continually during the decoding process, their values are available as soon as decoding is complete, without adding more latency. In some embodiments, the values of $F_{0\to1}$ and $F_{1\to0}$ can be accessed even before the decoding process is completed, so as to provide an early estimate of the read threshold adjustment.

Figure 8:
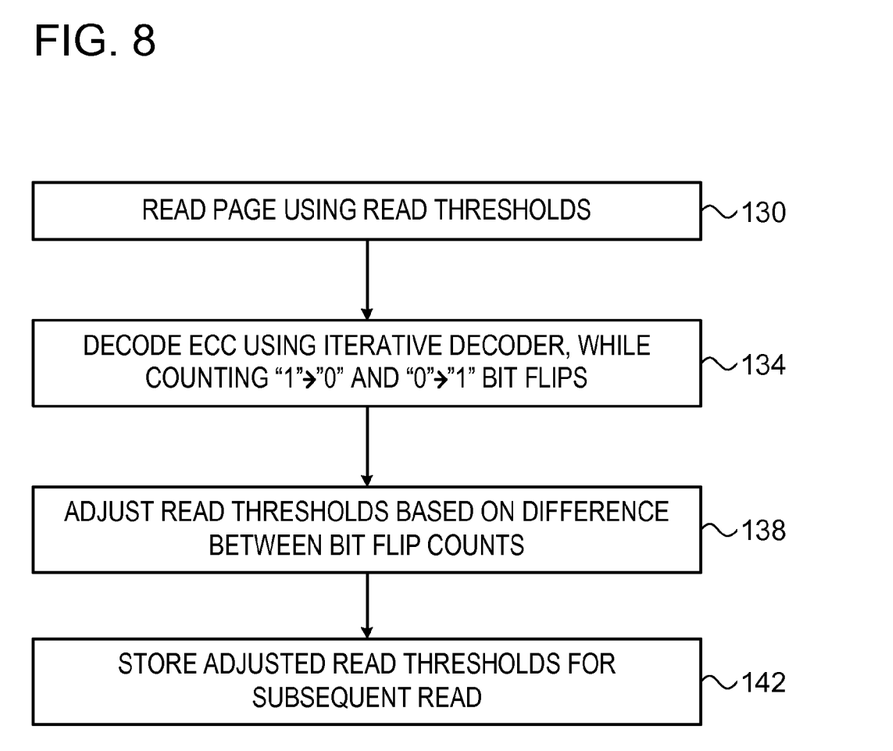
FIG. 8 is a flow chart that schematically illustrates a method for adapting read thresholds, in accordance with an embodiment of the present invention.

FIG. 8 is a flow chart that schematically illustrates a method for adapting read thresholds, in accordance with an embodiment of the present invention.

The method begins with memory controller 24 reading a page from memory device 28 using certain read thresholds, at a page readout step 130. The page contains an LDPC code word. The iterative LDPC decoder in the memory controller initializes counters $F_{0\to1}$ and $F_{1\to0}$ to zero.

The LDPC decoder applies an iterative process that decodes the LDPC code word, at a decoding step 134. During the decoding process, the decoder updates counters $F_{0\to1}$ and $F_{1\to0}$. In other words, the decoder increments counter $F_{0\to1}$ for each bit that is flipped from "0" to "1", and increments counter $F_{1\to0}$ for each bit that is flipped from "1" to "0".

When the decoding process is completed (e.g., when a valid code word was reached), the memory controller adjusts the read thresholds based on the difference between the counter values $(F_{0\to1}-F_{1\to0})$, at a threshold adjustment step 138. The memory controller stores the new read threshold value for future use, at a threshold storage step 142.

The memory controller may estimate the appropriate read threshold adjustment based on $(F_{0\to1}-F_{1\to0})$ using any suitable method. In some embodiments, the statistical distribution of the threshold voltages is known in advance. In such a case, the relation between $(F_{0\to1}-F_{1\to0})$ and the read threshold adjustment can be computed in advance. The relation can be stored in the memory controller, such as using a look-up table, a function or using any other suitable means. When decoding a given code word, the memory controller calculates $(F_{0\to1}-F_{1\to0})$, and then queries the stored relation to obtain the corresponding read threshold adjustment.

In an alternative embodiment, the memory controller can estimate the values of $C_{0\to1}$ and $C_{1\to0}$ based on the values of counters $F_{0\to1}$ and $F_{1\to0}$. For example, the relation between $(F_{0\to1}, F_{1\to0})$ and $(C_{0\to1}, C_{1\to0})$ can be characterized by simulation or experimentation, and then stored in the memory controller. When decoding a given code word, the memory controller calculates $F_{0\to1}$ and $F_{1\to0}$, queries the stored relation to obtain the corresponding values of $C_{0\to1}$ and $C_{1\to0}$, and adjusts the read threshold accordingly.

Further alternatively, the relation between $(F_{0\to1}, F_{1\to0})$ and the read threshold adjustment can be characterized a-priori, e.g., using simulation or experimentation, and then stored in the memory controller. When decoding a given code word, the memory controller calculates $F_{0\to1}$ and $F_{1\to0}$, queries the stored relation to obtain the corresponding read threshold adjustment, and adjusts the read threshold accordingly.

The description above addressed the adjustment of a single read threshold based on counting bit flips in a single page (code word). In some embodiments, however, a group of multi-level memory cells stores multiple pages (code words) that are read using multiple read thresholds. In some embodiments, the decoder maintains separate bit-flip counters for different read thresholds. Based on these counters, the memory controller is able to estimate the appropriate adjustment for each individual read threshold. In some embodiments, the memory controller stores previously-decoded results of one or more other pages that are stored in the same group of memory cells, and uses these results to count the bit flips that correspond to each individual read threshold.

Consider, for example, read threshold $T_2$ in FIG. 7 above. This read threshold is used for reading the MSB page, together with read threshold $T_3$. When the decoder decodes the code word stored in the MSB page, a "0"→"1" bit flip may be caused by two possible events:

- A flip with respect to read threshold $T_2$: A memory cell that belongs to distribution 124A (MSB="1") was incorrectly read as belonging to distribution 124B (MSB="0") and the code corrected its value back to "1".
- A flip with respect to read threshold $T_3$: A memory cell that belongs to distribution 124D (MSB="1") was incorrectly read as belonging to distribution 124C (MSB="0") and the code corrected its value back to "1".

The memory controller can differentiate between these two cases based on the previously-decoded results of the LSB page. In the present example, if the corresponding LSB value is "1", then the MSB flip occurred with respect to read threshold $T_2$. If the corresponding LSB value is then the MSB flip occurred with respect to read threshold $T_3$. In a similar manner, the memory controller can differentiate between "1"→"0" MSB flips that occur with respect to $T_2$ and with respect to $T_3$. Using this differentiation, the memory controller can maintain separate $F_{0 \to 1}$ and $F_{1 \to 0}$ counters for each individual read threshold. The memory controller can compute the appropriate read threshold adjustment for each read threshold based on the counter values of that read threshold.

Although the embodiments described herein mainly address data storage applications, the methods and systems described herein can also be used in other applications, such as in communication receivers.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A decoding apparatus, comprising:
   a decoder, which comprises circuitry that is configured to decode an Error Correction Code (ECC) by operating in one of:
   a first operational mode having a first power consumption; and
   a second operational mode, in which at least part of the circuitry that is active during the first operational mode is deactivated, and which has a second power consumption that is lower than the first power consumption; and
   a control unit, which is configured to evaluate a criterion with respect to an input code word, to select one of the first and second operational modes responsively to the criterion, and to invoke the decoder to decode the input code word using the selected operational mode.

2. The apparatus according to claim 1, wherein the control unit is configured to initially invoke the decoder to decode the input code word using the second operational mode, and, responsively to a failure in decoding the input code word using the second operational mode, to invoke the decoder to decode the input code word using the first operational mode.

3. The apparatus according to claim 1, wherein the control unit is configured to make a prediction whether the second operational mode is likely to succeed in decoding the input code word, and to select the one of the operational modes based on the prediction.

4. The apparatus according to claim 3, wherein the control unit is configured to make the prediction responsively to a success of the second operational mode in decoding one or more previous code words.

5. The apparatus according to claim 1, wherein the circuitry comprises first circuitry that is configured to decode the ECC in the first operational mode, and second circuitry that is configured to decode the ECC in the second operational mode, and wherein the control unit is configured to deactivate the first circuitry during the second operational mode, and to deactivate the second circuitry during the first operational mode.

6. The apparatus according to claim 1, wherein the decoder is configured to decode the ECC by processing soft metrics when operating in the first operational mode, and by processing hard metrics when operating in the second operational mode.

7. The apparatus according to claim 1, wherein the decoder is configured to decode the ECC by processing first soft metrics represented at a first quantization level when operating in the first operational mode, and by processing second soft metrics represented at a second quantization level, coarser than the first quantization level, when operating in the second operational mode.

8. The apparatus according to claim 1, wherein the decoder is configured to decode the ECC at a first decoding speed when operating in the first operational mode, and at a second decoding speed, lower than the first decoding speed, when operating in the second operational mode.

9. The apparatus according to claim 1, wherein the decoder and the control unit are comprised in a memory controller that stores data in a memory comprising multiple memory cells, and wherein the input code word is read from a group of the memory cells.

10. The apparatus according to claim 9, wherein the criterion depends on a wear level of the group of the memory cells.

11. The apparatus according to claim 9, wherein the criterion depends on a distortion level in the group of the memory cells.

12. The apparatus according to claim 9, wherein the ECC is defined by a set of parity check equations, and wherein the criterion depends on a number of the parity check equations that are met by the input code word.

13. The apparatus according to claim 9, wherein the circuitry is configured to decode the ECC word by processing soft metrics in a soft decoding process when operating in the first operational mode, by processing hard metrics in a hard decoding process when operating in the second operational mode, and by processing the hard metrics in the soft decoding process when operating in a third operational mode, and wherein the control unit is configured to cause the decoder to decode the input code word using one of the first, second and third operational modes responsively to the criterion.

14. The apparatus according to claim 13, wherein the control unit is configured to initially invoke the decoder to decode the input code word using the second operational mode, to invoke the decoder to decode the input code word using the third operational mode responsively to a failure in decoding the input code word using the second operational mode, and to invoke the decoder to decode the input code word using the first operational mode upon failing to decode the input code word using the third operational mode.

15. The apparatus according to claim 9, wherein the input code word is stored in a given page in the memory, wherein the decoder comprises a metric calculation unit, which is configured to cache the given page and one or more additional pages read from the memory and to compute metrics for decoding the input code word based on the cached given page and additional pages, and wherein the circuitry is configured to decode the input code word using the metrics.

16. The apparatus according to claim 15, wherein the additional pages comprise at least one page type selected from a list of types consisting of:
   a first page type, which is stored in another group of the memory cells that potentially causes interference to the group of the memory cells;
   a second page type, which is stored in the group of the memory cells together with the given page;
   a third page type, which comprises a version of the given page that is re-read using read thresholds that are different from the given page; and
   a fourth page type, which comprises a copy of the given page that is re-read using the same read thresholds as the given page.

17. The apparatus according to claim 9, wherein the input code word is read from the group of the memory cells using one or more read thresholds, and wherein the decoder is configured to decode the input code word by applying an iterative process that iteratively flips bits of the input code word, to count a first number of first events in which any of the bits is flipped from "0" to "1", to count a second number of second events in which any of the bits is flipped from "1" to "0", and to compute an adjustment for application to at least one of the read thresholds based on the first and second numbers.

18. The apparatus according to claim 1, wherein the decoder and the control unit are comprised in a communication receiver that receives a communication signal comprising the input code word.

19. A decoding method, comprising:
   operating a decoder, which includes circuitry that decodes an Error Correction Code (ECC) by operating in one of:
      a first operational mode having a first power consumption; and
      a second operational mode, in which at least part of the circuitry that is active during the first operational mode is deactivated, and which has a second power consumption that is lower than the first power consumption;
   evaluating a criterion with respect to an input code word;
   selecting one of the first and second operational modes responsively to the criterion; and
   invoking the decoder to decode the input code word using the selected operational mode.

20. The method according to claim 19, wherein invoking the decoder comprises initially invoking the decoder to decode the input code word using the second operational mode, and, responsively to a failure in decoding the input code word using the second operational mode, invoking the decoder to decode the input code word using the first operational mode.

21. The method according to claim 20, wherein making the prediction comprises predicting a success of the second operational mode in decoding the input code word responsively to the success of the second operational mode in decoding one or more previous code words.

22. The method according to claim 19, wherein selecting the one of the operational modes comprises making a prediction whether the second operational mode is likely to succeed in decoding the input code word, and choosing the one of the operational modes based on the prediction.

23. The method according to claim 19, wherein operating the decoder comprises operating first circuitry that decodes the ECC in the first operational mode, and second circuitry that decodes the ECC in the second operational mode, and wherein invoking the decoder comprises deactivating the first circuitry during the second operational mode, and deactivating the second circuitry during the first operational mode.

24. The method according to claim 19, wherein operating the decoder comprises decoding the ECC by processing soft metrics when operating in the first operational mode, and by processing hard metrics when operating in the second operational mode.

25. The method according to claim 19, wherein operating the decoder comprises decoding the ECC by processing first soft metrics represented at a first quantization level when operating in the first operational mode, and by processing second soft metrics represented at a second quantization level, coarser than the first quantization level, when operating in the second operational mode.

26. The method according to claim 19, wherein operating the decoder comprises decoding the ECC at a first decoding speed when operating in the first operational mode, and at a second decoding speed, lower than the first decoding speed, when operating in the second operational mode.

27. The method according to claim 19, wherein the input code word is read from a group of memory cells of a memory.

28. The method according to claim 27, wherein the criterion depends on a wear level of the group of the memory cells.

29. The method according to claim 27, wherein the criterion depends on a distortion level in the group of the memory cells.

30. The method according to claim 27, wherein the ECC is defined by a set of parity check equations, and wherein the criterion depends on a number of the parity check equations that are met by the input code word.

31. The method according to claim 27, wherein operating the decoder comprises decoding the ECC word by processing soft metrics in a soft decoding process when operating in the first operational mode, by processing hard metrics in a hard decoding process when operating in the second operational mode, and by processing the hard metrics in the soft decoding process when operating in a third operational mode, and wherein selecting the one of the operational modes and invoking the decoder comprise causing the decoder to decode the code word using one of the first, second and third operational modes responsively to the criterion.

32. The method according to claim 31, wherein invoking the decoder comprises initially invoking the decoder to decode the input code word using the second operational mode, invoking the decoder to decode the input code word using the third operational mode responsively to a failure in decoding the input code word using the second operational mode, and invoking the decoder to decode the input code word using the first operational mode upon failing to decode the input code word using the third operational mode.

33. The method according to claim 27, wherein the input code word is stored in a given page in the memory, and wherein operating the decoder comprises caching the given page and one or more additional pages read from the memory, computing metrics for decoding the input code word based on the cached given page and additional pages, and decoding the input code word using the metrics.

34. The method according to claim 33, wherein the additional pages comprise at least one page type selected from a list of types consisting of:
   a first page type, which is stored in another group of the memory cells that potentially causes interference to the group of the memory cells;
   a second page type, which is stored in the group of the memory cells together with the given page;

a third page type, which comprises a version of the given page that is re-read using read thresholds that are different from the given page; and a fourth page type, which comprises a copy of the given page that is re-read using the same read thresholds as the given page.

35. The method according to claim 27, wherein the input code word is read from the group of the memory cells using one or more read thresholds, and wherein operating the decoder comprises decoding the input code word by applying an iterative process that iteratively flips bits of the input code word, counting a first number of first events in which any of the bits is flipped from "0" to "1", counting a second number of second events in which any of the bits is flipped from "1" to "0", and computing an adjustment for application to at least one of the read thresholds based on the first and second numbers.

36. The method according to claim 19, wherein the input code word is received over a communication signal.

* * * * *